United States Patent [19]

Cuomo et al.

[11] Patent Number: 5,179,264

[45] Date of Patent: Jan. 12, 1993

[54] SOLID STATE MICROWAVE POWERED MATERIAL AND PLASMA PROCESSING SYSTEMS

[75] Inventors: Jerome J. Cuomo, Lincolndale; Charles R. Guarnieri, Somers; Stanley Whitehair, Peekskill, all of N.Y.

[73] Assignee: International Business Machines Corporation, Armonk, N.Y.

[21] Appl. No.: 450,343

[22] Filed: Dec. 13, 1989

[51] Int. Cl.$^5$ .............................................. B23K 9/00
[52] U.S. Cl. ........................... 219/121.43; 219/121.36; 219/121.52; 219/10.55 B; 219/10.55 R
[58] Field of Search ........... 219/121.43, 121.4, 121.44, 219/121.36, 10.55 B, 10.55 F, 10.55 R, 10.493

[56] References Cited

U.S. PATENT DOCUMENTS

| 3,691,338 | 9/1972 | Chang | 219/10.55 B |
|---|---|---|---|
| 4,314,128 | 2/1982 | Chitre | 219/10.55 B |
| 4,503,406 | 5/1985 | Bowling . | |
| 4,631,380 | 12/1986 | Tran | 219/10.55 F |
| 4,642,571 | 2/1987 | Minami . | |
| 4,644,296 | 12/1987 | Crossley | 331/1 R |
| 4,714,812 | 12/1987 | Haagersen et al. | 219/10.55 B |
| 4,745,337 | 5/1988 | Pichot . | |
| 4,777,336 | 10/1988 | Asmussen | 219/10.55 |

FOREIGN PATENT DOCUMENTS

| 0053841 | 6/1982 | European Pat. Off. | 6/68 |
|---|---|---|---|
| 0085110 | 8/1983 | European Pat. Off. | 6/64 |
| 0209469 | 1/1987 | European Pat. Off. | 1/18 |

Primary Examiner—Mark H. Paschall
Attorney, Agent, or Firm—Roy R. Schlemmer; Blaney B. Harper

[57] ABSTRACT

A solid state microwave generator is utilized as an excitation source for material/plasma processes. The invention provides very close precise control of the solid state device's power levels to control the ultimate power output and frequency which control is not readily possible with vacuum tube devices. Utilizing the concepts of the invention the total power generated by the system may be easily varied and, further, the power may be easily monitored and used to control other device parameters such as frequency and the like. Because of the degree of control possible within the overall process system of the invention any measurable physical property of the process such as temperature, power, color (e.g., optical pyrometer), or the like that can be monitored and converted to a control signal can be utilized by the present system to carefully control the overall process conditions. These control features are lacking in currently available vacuum tube microwave devices. It is also probable that the overall cost of the solid state based microwave power generators systems will be far less than that of comparable tube type microwave generators.

10 Claims, 4 Drawing Sheets

SOLID STATE MICROWAVE POWERED MATERIAL AND PLASMA PROCESSING SYSTEMS

FIELD OF THE INVENTION

The present invention relates generally to methods and apparatus using microwave energy sources to energize plasma and material processing apparatus. More particularly, it relates to the use of more efficient, controllable solid state devices as the source of the microwave energy.

BACKGROUND OF THE INVENTION

Materials and plasma processes continue to put demands on excitation methods. Recently, the high frequency excitation that is in the microwave region 300 MHz to 1,000 GHz has demonstrated the production of unique conditions for materials and plasma processes. For example, plasmas excited by microwaves can exist under conditions not easily achieved by other methods from about $10^{-3}$ Torr to greater than atmospheric pressure. Coupled with magnetic fields, an Electron Cyclotron Resonance (ECR) region can be achieved producing intense plasmas in the range of from $10^{-2}$ to $10^{-7}$ Torr Microwave power is very useful for generating plasmas for several reasons. It is a very efficient source of power for the free electrons. The time average power absorbed by these electrons is proportional to the electron density and the effective electric field squared. The effective electric field has a maximum value when the frequency of the power source equals the effective electron collision frequency. (Refs. 1 and 2) For gases typically used in plasma processing this electron collision frequency is in the microwave region of the spectrum. Most current plasma processing techniques (etching and deposition) currently use a frequency of 13.56 MHz, e.g., Diode sputtering, Reactive Ion Etching, etc.. For microwave radiation the frequency is a few hundred to several thousand times this. The frequency commonly used in microwave plasma processing is 2.45 GHz. 2.45 GHz is one of the designated Industrial Scientific Medical (ISM) oven heating frequencies. This is the frequency that is used in most commercially available home microwave ovens. Power supplies that operate at this frequency are readily available. They make use of a microwave tube called a magnetron to generate microwave energy. For a given power input, microwaves result in a greater electron density in the plasma than RF plasmas due to the frequency effects. Since the plasmas are almost neutral, this results in a higher ion density. This higher ion density results in higher processing rates, i.e., higher deposition and etching rates.

Another advantage of microwave processing is related to how the power is coupled to the plasma. Although there are many different ways of coupling microwave power to a plasma, (Ref. 3 and the references cited therein) they have one useful feature in common. The metal electrodes of the applicator are usually external to the vacuum system containing the plasma. The microwave power is coupled through a dielectric medium such as fused quartz or sapphire. This results in less contamination of the plasma and the parts being processed by the metal electrodes usually used with lower frequency processes and with reactive plasmas such as oxygen, chlorine, fluorine and the like. In addition to the decreased contamination, there is the elimination of the consumption of the metal electrodes by these reactive species.

Due to higher electron densities, microwave driven plasmas are more efficient sources of radicals that are used in plasma processing. By controlling the plasma conditions, particular species of radical production may be enhanced. In general, high pressure (>10 mt) microwave discharges are good sources (i.e., high density) of radical species. (Ref. 4) Furthermore, in a microwave driven plasma, the temperature (energy) of the neutral gas component of the plasma can be much higher than in the more conventional lower frequency plasmas. Mechanisms, such as viscous heating of the neutral species by the energetic electrons, can result in higher processing reaction rates.

In addition to the denser plasmas that can be o obtained with the higher frequency microwave power, there are resonant phenomena that occur that further enhance the coupling of microwave power to the plasma. Electron cyclotron resonance or ECR as it is called is an example of this enhanced coupling. For ECR the frequency of electron motion around a magnetic field direction (determined by the magnitude and direction of the magnetic field and the electron velocity) is the same as the frequency of the microwave radiation. For 2.45 GHz radiation a magnetic field with a magnitude of 875 Oersteds is needed. When this condition is met, there is an enhancement in the power absorbed by the free electrons of the plasma. With ECR enhancement greater than 10%, ionization is possible (Refs. 5 and 6).

In semiconductor and other plasma processing applications, intense microwave discharges are important in many applications such as deposition, etching, ashing, and ion beam generation. Many commercial systems are available to do microwave processing. Testing has shown that microwave technology has considerable advantage over existing technology. However, most existing microwave processing technology is limited in that it relies on vacuum tube technology, therefore, the limitations are imposed on the processes. Further, most plasma and material processing supplies are based on commercial home oven magnetrons operating at 2.45 GHz and are therefore limited in the applications they can be used in, due to the inherent limitations of tube technology.

Microwave solid material processing per se is becoming increasingly important as a manufacturing processing technique. These processes include heating, curing, sintering, annealing or, in general, any process that directly couples microwaves into a solid or liquid material intending to change the chemical or physical structure of that material. Microwave excitation has several advantages over conventional techniques such as thermal or chemical processing. The microwave process is usually more efficient and faster. End point detection of the microwave process is usually available by monitoring, for example, the forward and reflected power (See for example Ref. 7). These advantages result from the direct coupling of the microwave energy into the chemical bond (usually a dipolar interaction). Because the energy is coupled internal to the system, the processing takes place at a faster rate than in conventional processing. For example, microwave curing of polymers results in lower thermal stress within the material than other techniques due to the direct energy coupling which reduces processing time. Further, as the material cures, it absorbs less energy except in regions still curing.

Microwave processing systems are available commercially. These systems have significant disadvantages that limit their use in some critical applications, again, through the use of oven magnetrons. Lack of microwave electromagnetic field uniformity is one disadvantage. Although some of these systems use resonant applicators or slotted waveguides, most of these systems are little more than multi-moded microwave ovens. In these systems, for regions of low electromagnetic field, the curing will be slower than in regions of high electromagnetic fields. Another important problem that currently available tube type microwave systems have is a lack of process control. In the typical oven type system it is very difficult to tell when a process is completed and to correct for problems in the process, such as overheating.

Two different types of microwave sources, solid state and vacuum tube, are currently known in the art. There are many different types of tube sources of microwave power, e.g., magnetrons, klystrons, gyrotrons, and the like (Ref. 8). Tubes have advantages in that they are capable of operating at higher frequencies and higher power levels. Power output and to a limited extent, frequency, can be adjusted with tube type sources. This can be done with dc bias voltages and magnetic fields. However, with the magnetron source, the most readily available and least expensive of the tube-type sources (for low power levels—less than several kW), the phase cannot be controlled. The other types of tube sources can be used with phase control, but they are very expensive and operate at the higher power levels of several tens of kW and more. Their main disadvantages are that they are large, bulky, very expensive, heavy and require high voltage from the anode to the cathode and high current for a filament. Tubes are also difficult to control and have short lifetimes.

In general all microwave tubes produce microwave power by converting the kinetic energy of an electron beam in a vacuum into electromagnetic energy. Different types of tubes employ different coupling structures to do this. No coupling structure is optimal, each has its advantages and disadvantages.

For example, traveling wave tubes use a helix coupling structure to convert the energy of the electron beam into electromagnetic energy. A klystron uses a series of cavity couplers to do the same thing. A magnetron bends the electron beam into a helix using a magnetic field, then converts the kinetic energy of the electron beam into microwave energy using a series of tuned cavities mounted radially around the center axis.

All of these tubes have similar advantages and disadvantages associated with their use when compared to solid state devices. All of these tubes require a source of electrons. In all microwave tubes, this is provided by a hot filament. To drive the filament, a low voltage high current supply is required. The filament causes problem in that it is very sensitive to vibration, produces large energy losses due to its inefficient nature, contributes to the heating of the tube and limits the lifetime of the tube. In general, filament failure is one of the leading causes of tube failure.

The second requirement of microwave tubes is an electron beam moving at a considerable velocity. This places more requirements on the design and use of the tubes. To accelerate the beam and keep it from spreading, a high potential is required in a high vacuum environment. This required potential, in turn, requires the use of a high voltage, low current supply. These supplies are expensive, bulky and difficult to operate. To prevent scattering of the beam, the tube is designed as a high vacuum chamber. This contributes greatly to the cost and complexity of the microwave tube. Most tubes have getters designed into the filament structure to maintain this vacuum. However, loss of vacuum integrity is the second most common failure mode in microwave tubes.

The third requirement in a microwave tube is a coupling structure to convert the energy in the electron beam into microwave power. As mentioned earlier, these structures vary in different tubes. However, all tubes share common problems with its use. These structures are very complex and difficult to machine. Typical machine tolerance is one ten thousands of an inch. Also microwave absorption in these structures is a big source of heat in these tubes. This requires some method of cooling that adds to the cost, bulk and complexity of the tube and the overall supporting structure.

A noteworthy example of volume production economics is the home microwave oven operating at 2.45 GHz. Because of the millions of tubes produced every year, manufacturing costs have been reduced to about five dollars per tube. These problems have been somewhat alleviated by spreading development and tooling costs over the large number of tubes produced. Through iterative improvements, problems such as cooling, lifetime and size have been addressed. Although, these tubes are reasonably compact and have reasonable lifetime (e.g. 2000 hours or more), their power supplies are still bulky and require high voltage but are easy to obtain. However, the tubes are oscillators and thus operate only at 2.45 GHz. Further, since they are in effect a "diode" device, they oscillate effectively at full power. This means that there is no effective way to control the frequency or power output of these tubes.

It should be noted, in general, that a microwave tube can be built that can match the overall performance characteristics of any solid state device such as bandwidth and output power. However, it will cost approximately a thousand times more, be many times larger and heavier, consume more power, require complicated supply voltages, have limited lifetimes and have minimal controls of power output and other operating parameters such as phase, bandwidth and noise.

Except for military radar and communication applications, all microwave power generators in use currently are based on microwave tube technology. These tubes were developed during World War II and have changed very little functionally since then. These tubes can generate large amounts of power at frequencies up to the tera Hertz range. However, as stated previously, these tubes are heavy, bulky, inefficient, require high voltages and currents, expensive and have short lifetimes. All of these factors are very important in a manufacturing environment.

Because of all of the aforementioned problems with microwave tubes, most existing commercially available microwave supplies use oven magnetrons operating at 2.45 GHz. This limits the equipment and the applications it can be used in.

DESCRIPTION OF THE PRIOR ART

The prior art falls into two general categories, the first of which comprises a combination of a conventional microwave source coupling into a process reaction chamber (or applicator as known by those practicing the art) as exemplified by the U.S. Pat. No. 4,777,336, issued to Asmussen, entitled METHOD FOR TREATING A MATERIAL USING RADIO FREQUENCY WAVES, which generally discloses hardware whereby the single mode or controlled multimode heating of materials by microwave induced plasmas will allow programmed processing within a reaction chamber.

A second patent of this category is U.S. Pat. No. 4,745,337, issued to Pichot et al., entitled METHOD AND DEVICE FOR EXCITING A PLASMA USING MICROWAVES AT THE ELECTRONIC CYCLOTRONIC RESONANCE, which discloses a method and physical device for exciting a plasma using microwaves at the electronic cyclotronic resonance frequency. The resulting plasma can be used in a variety of applications such as material surface treatment or the production of ion beams. Both of these patents are directed to the "applicator" not to the methods of generation.

The second class of references includes, for example, U.S. Pat. No. 4,642,571, issued to Minami et al., entitled MICROWAVE PULSE SOURCE, and 4,503,406, issued to Bowling et al., entitled INSIDE COLLECT FOR COAXIAL PLACEMENT OF DIODE, both of which discloses GUNN and IMPATT diodes as microwave sources. The Minami reference in particular relates to a system utilizing superconductors for accumulating or accentuating the very limited power of a solid state microwave source for coupling into systems requiring large power, such for example as a Tokamak fusion test reactor. Neither of these references discloses or suggests utilizing a solid state microwave generator for powering a material processing system either for energizing a reactive plasma or direct material processing radiation.

The following six patents all issued to J. Asmussen per se or J. Asmussen et al., all relate generally to the physical details of the applicator or specific means by which microwave is introduced onto some sort of reaction chamber and do not directly relate to nor suggest the broad concept of using solid state microwave sources to power plasma and material processing apparatus.

4,507,588,
4,585,668
4,630,566
4,691,662
4,727,293
4,792,772

SUMMARY AND OBJECTS

It is a primary object of the present invention to provide an improved microwave powered material/plasma processing system utilizing solid state microwave generators as the power source.

It is another object of the invention to provide such microwave powered processing systems having high degree of control over the power, frequency and phase of the microwave energy within the process chamber.

It is another object of this invention to provide such a system wherein a plurality of such solid state microwave sources may be utilized to provide greatly enhanced electromagnetic field uniformity and process control within the reaction chamber.

It is another object of the invention to provide such a microwave powered processing system wherein the phase, frequency, power and spectrum may be controlled to change coupling on the work surface to selectively energize different materials within the same system during essentially the same process step.

It is another object of the invention to utilize such a solid state microwave powered processing system wherein the return signal may be easily examined to adjust the various process parameters within a reaction chamber.

It is a further object of the invention to utilize such a solid state microwave powered processing system which is much smaller in size and far more economical to build and operate than currently available tube type microwave powered processing systems of the prior art.

It is another object of the invention to make use of multiple excitation frequencies simultaneously.

It is another object of the invention to use such simultaneous multiple frequencies to control different parts of a process, reaction or chemistry.

Other objects, features and advantages of the present invention will be apparent from the following description of a preferred embodiment of the invention as set forth in the specification, drawings and claims.

The objects of the present invention are accomplished in general by using solid state microwave generators as excitation sources for material and plasma processes. The inherent advantages of the solid state device which can be controlled at low current, voltage, power and phase are significant with respect to the currently universally used vacuum tube technology. Not only can the reflected power signal from the applicator be controlled at the low power end more easily, but return signals in the reaction chamber can be easily sensed and or monitored to modify the generator output in response to process changes. Because of this, any measurable physical property such as temperature, power, weight, color or the like that can be converted to a proportional voltage or current signal can be used by this technique for process control. These features are lacking in current vacuum tube microwave processes and, therefore, unavailable to critical processes where control is essential. Further, these microwave power sources are much more economical in terms of cost, space requirements and energy efficiency.

DESCRIPTION OF THE PREFERRED EMBODIMENT

Figure 1:
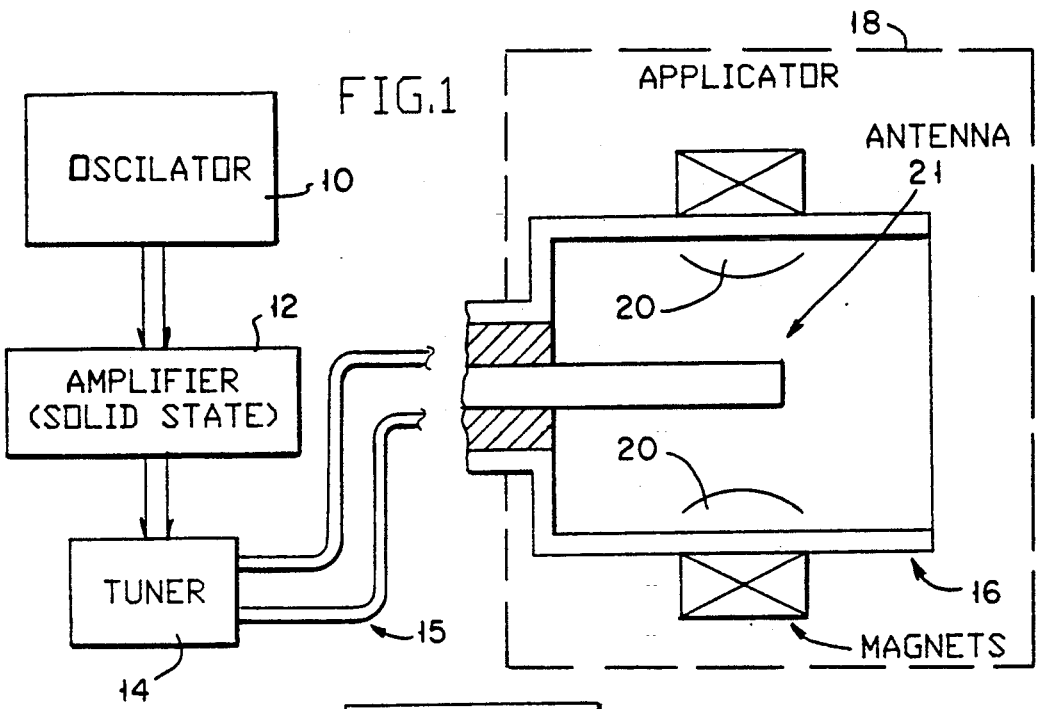
FIG. 1 comprises a combination functional block diagram and cross sectional view of a solid state microwave energized material/plasma processing apparatus.

Solid state devices possess a number of advantages that make them ideal for use as a microwave source in plasma and material processing. They are small, efficient and require easily obtained supply voltages and currents. They also can easily be used in arrays and have the necessary phase and amplitude control that permit adjustment to obtain desired field intensities throughout, for example, large reaction chambers. The power output from individual transistors may be added by methods such as transformer coupling.

The power and frequency at which solid state devices operate are increasing at a rapid rate. Because of this, solid state devices are replacing tubes in many communication and radar applications. Solid state devices have many properties that make their use advantageous. They are compact, light weight, efficient, low cost, operate at moderate voltages and currents, vibration insensitive and have long lifetimes and are controllable to a much greater extent than tube type devices.

According to the teachings of the present invention, solid state devices are used as the source of microwave power or radiation for plasma or material processing. These solid state devices are in effect power supplies for the process apparatus where the operating frequencies may be selected to optimize the processing to be done or to use existing microwave applicators. These solid state devices may be comprised of bipolar or field effect (i.e., MOSFET) transistors. Other solid state devices may be used. A more detailed description of such high frequency operable, high power output devices will be set forth subsequently. Conventional methods of power, current, voltage, and phase control may be used. The solid state devices may be any of the standard Class A, B, AB or C amplifiers or they may be of a resonant oscillator class all of which are well known in the electronics art.

For the purpose of plasma processing, the plasma applicator is comprised of several elements where the electro-magnetic field amplitude (not just power) and phase of the microwave radiation and its spatial distribution may be controlled. By controlling these, the spatial distribution of the resultant microwave power may be controlled. With the solid state power devices of the present invention, this control may be done with low power levels.

For an in depth description of the operation and controllability of Solid State microwave sources in general, see for example Ref. 9. For a discussion of the use of a plurality of relatively low power (e.g., 10 watts,) devices to achieve a larger overall power output see Ref. 10 (pgs. 194-199). With a plurality of sources, each identical and being driven at the same power level, the resultant electric field at a position in space is given by the vector sum of the electric fields. The resultant power density at that position is proportional to the appropriate product of the electric field and the magnetic field. (Ref. 3) This resultant power density can be related to the magnitude of the resultant electric field squared. If each of the sources has a random phase (or a phase that is slowly varying with time), the time average resultant power density is just the power density from one of the sources times the number of sources. If the phase of each source is adjusted so its electric field at a position is in phase with all of the other sources, the resultant power density at that position is proportional to the square of the magnitude of the electric field from one source times the square of the number of sources. An alternative implementation of this concept doesn't require all of the sources to be identical and the phases of each source can be varied to obtain a desired electric field distribution (thus a power density distribution).

As stated previously, it is only in recent years that transistor amplifiers capable of operating in the microwave region and capable of producing power output in the 10-100 watt range have been developed. These devices developed primarily for military application such as RADAR and other communication systems have, as yet, seen little commercial application. As will be appreciated materials capable of withstanding the operating temperatures have only recently been available. And processes capable of producing devices of such materials and said devices have the required distributed circuit parameters such as impedance, inductance and capacitance which allows the devices to operate successfully at high frequency has taken many years to develop. The following reference(s) describe such devices and processes making same. (Refs. 10 and 11)

An example of a solid state microwave energized plasma system is shown in FIG. 1. This system can be divided into several functional components. First a microwave oscillator 10 is used to provide a stable frequency source. The output of the oscillator is fed directly into a linear solid state microwave amplifier 12. The amplifier boosts the microwave power level from the milliwatt range to the watt range. The output of the amplifier is then fed into a tuner 14 that impedance matches the microwave generator and transmission system 15 into a microwave applicator 16 which powers the desired process. In this example an electron-cyclotron resonance (ECR) plasma applicator system 16 is illustrated. The microwaves are coupled through a vacuum feedthru into a process chamber 18. A magnetic field inside the chamber provides the cyclotron motion to the electrons moving along its field lines. At a certain field strength the cyclotron motion synchronizes with the driving microwave field, hence an "electron cyclotron resonance" region 20 occurs capable of transferring large amounts of power to the electron gas at very low pressure. Other types of microwave applicators are possible, both for material processing and for other plasma processing applications. The use of the herein disclosed solid state supply is adaptable to all of these applicators.

Figure 2:
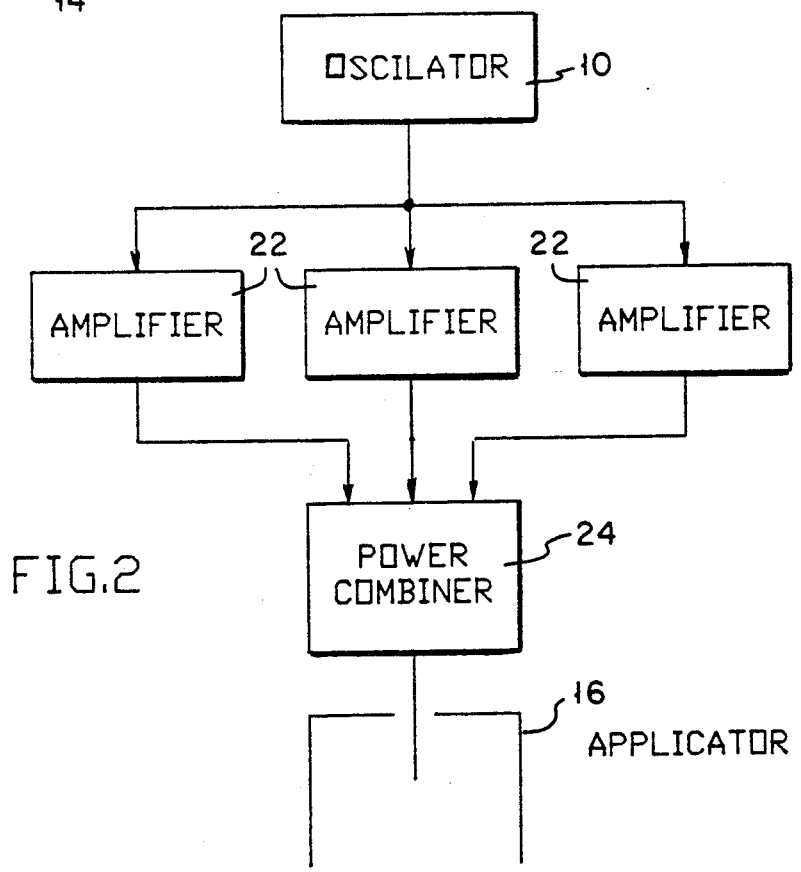
FIG. 2 comprises a diagrammatic drawing similar to FIG. 1 showing a plurality of solid state microwave sources powering the process apparatus.

FIG. 2 shows an extension of FIG. 1 for use with higher levels of power. Multiple solid state amplifiers 22 operating in parallel are used to increase the final power level. The output of all of these amplifiers is then fed into a power combiner 24 that matches the outputs of all of the amplifiers into a single transmission line. Combiner 24 is analagous to the tuner 14 of FIG. 1. Using this technique several kilowatts of microwave power can be produced.

It is recognized that there are many different methods which will allow the boosting of the final output power levels. It is the intent of the present invention to realize the resultant increased power output in controlled processing which these solid state systems provide. (Ref. 12)

Figure 3:
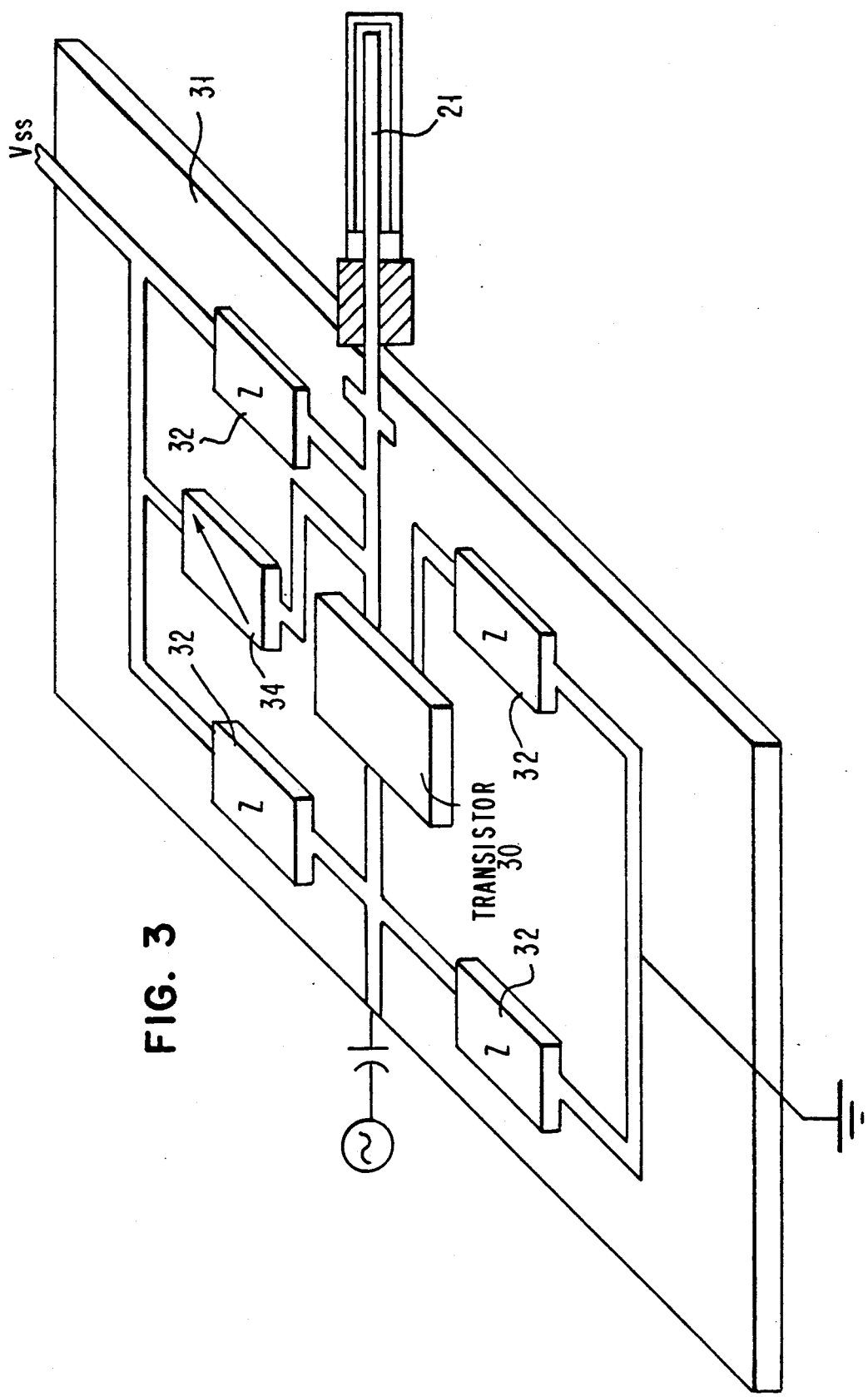
FIG. 3 comprises an illustration of the details of construction of a solid state microwave amplifier/generator constructed in accordance with the teachings of the present invention showing a dipole radiative element attached thereto said amplifier/generator being suitable for use in the apparatus of FIGS. 1 or 2.

FIG. 3 illustrates the extent to which solid state-circuits can be integrated to the produce a very compact, high power, solid state amplifier, thus illustrating one of the advantages of the present invention. Instead of building all of the components of the system as separate or discrete units, this figure illustrates how all of the amplifier elements could be built into a single high power system on a common substrate as is well known in the VLSI arts in general. These techniques can also be employed to produce IC microwave power amplifiers. Typically oscillators are kept external. The solid state devices of the present invention are the amplifiers.

Figure 4A:
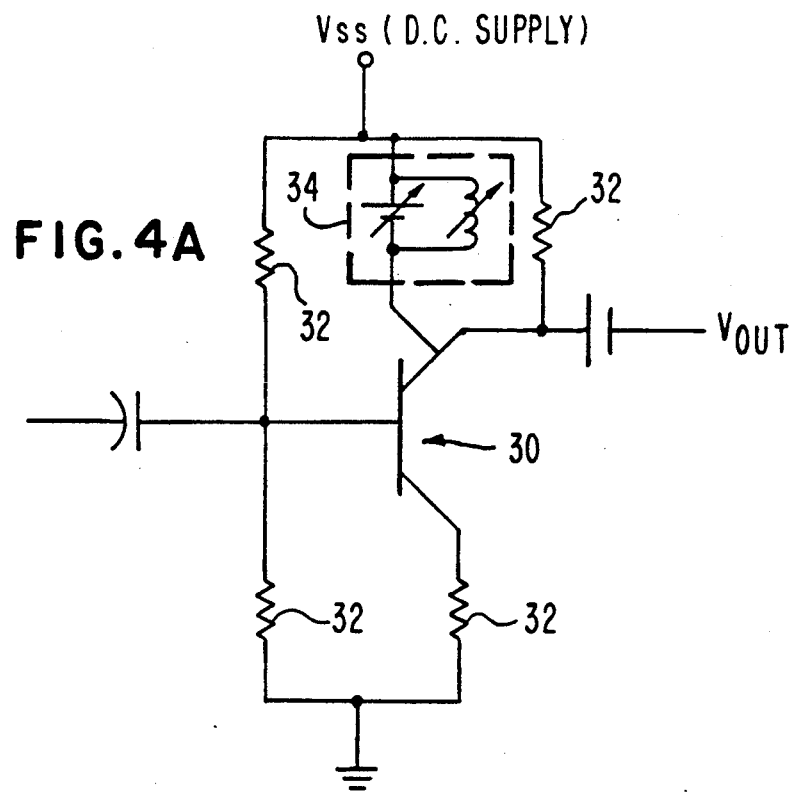
FIGS. 4A and 4B comprise schematic diagrams of the electrical circuitry of two possible configurations for energizing the solid state microwave generator of the present invention and, which also illustrates the circuit elements which control the frequency and amplitude (power) of the output.

Reference should also be made to FIG. 4A, which is a schematic diagram of the solid state amplifier of FIG. 3 wherein, similar components have the same reference numbers. The power transistor 30 constructed as described above to operate at microwave frequency levels and several watts of power is suitably fabricated on the substrate 31.

The four load impedances 32 are also deposited on the substrate by well known techniques, as well as all the wiring. A convention output isolation capacitor 36 as also provided. A tunable element 34 is provided to sharpen the Q of the broad band amplifier but is not a frequency determining element per se. The frequency control is provided by control of the external low power oscillator 10.

The antenna 21 may be physically attached directly to the circuit substrate. This is illustrated schematically as the actual attachment could be done in a number of ways. This has the advantage that the only feed thrus necessary are for the DC supply voltage and these are easily and routinely constructed. This unit is then a small, compact plasma source that can easily be incorporated into the back of a larger ion beam source for example.

Figure 4B:
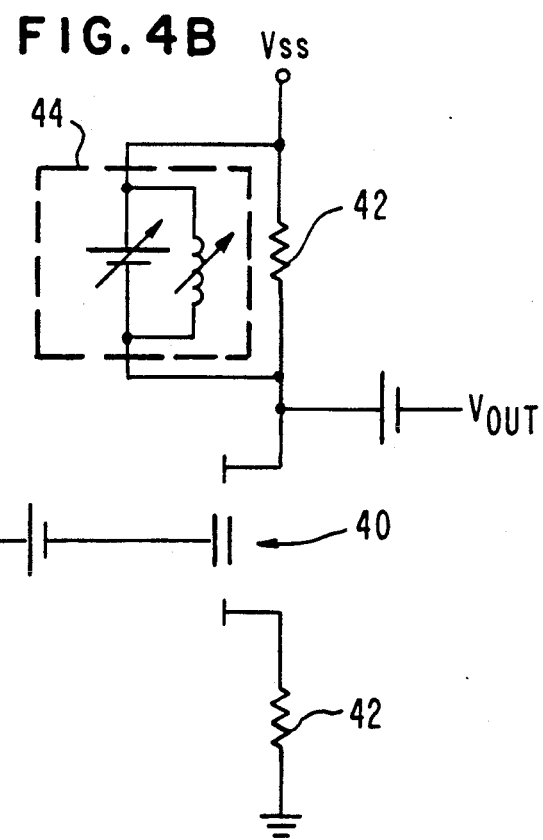

FIGS. 4A and 4B show examples of the circuit diagrams of two different types of wide band solid state amplifiers. FIG. 4A shows a bipolar transistor in a common emitter amplifier configuration. The tuning element 34 simply sharpens and shapes the amplifier Q response curve but as stated above is not a frequency determining element per se as will be well understood by those skilled in the art. The function of the various circuit elements of this configuration is the same as in common emitter amplifiers operating at lower frequency. It has the advantages of simplicity, high power levels and stability.

FIG. 4B shows an example of a MOSFET common drain amplifier showing the MOSFET 40, load resistors 42, and tunable element 44 all of which may be readily fabricated using solid state techniques. This circuitry also functions in an analogous manner to common drain amplifiers operating at lower frequencies. This amplifier has the advantages of high gain and efficiency. In this figure it is also assumed that an external oscillator is used. It would of course be possible, if desired to fabricate the oscillator on the same substrate or either of the high power amplifiers of FIGS. 4(A) and 4 (B).

While the IEEE article entitled "Silicon Bipolar Microwave Power Transistors" of R. Allison (Ref. 12) describes the details of the manufacture of suitable power transistors capable of operating in the microwave region, it is noted in general that the junctions must be very small to operate in the desired frequency range. This causes great power densities and heat generation within said smaller junctions which previous structures have heretofore been unable to handle. By keeping the junctions small stray circuit effects do not prevent their operating in the microwave region. The state of the art is continuing to improve these structures by reducing parasitic capacitance and making smaller junction regions of materials that can handle larger power densities.

Figure 5:
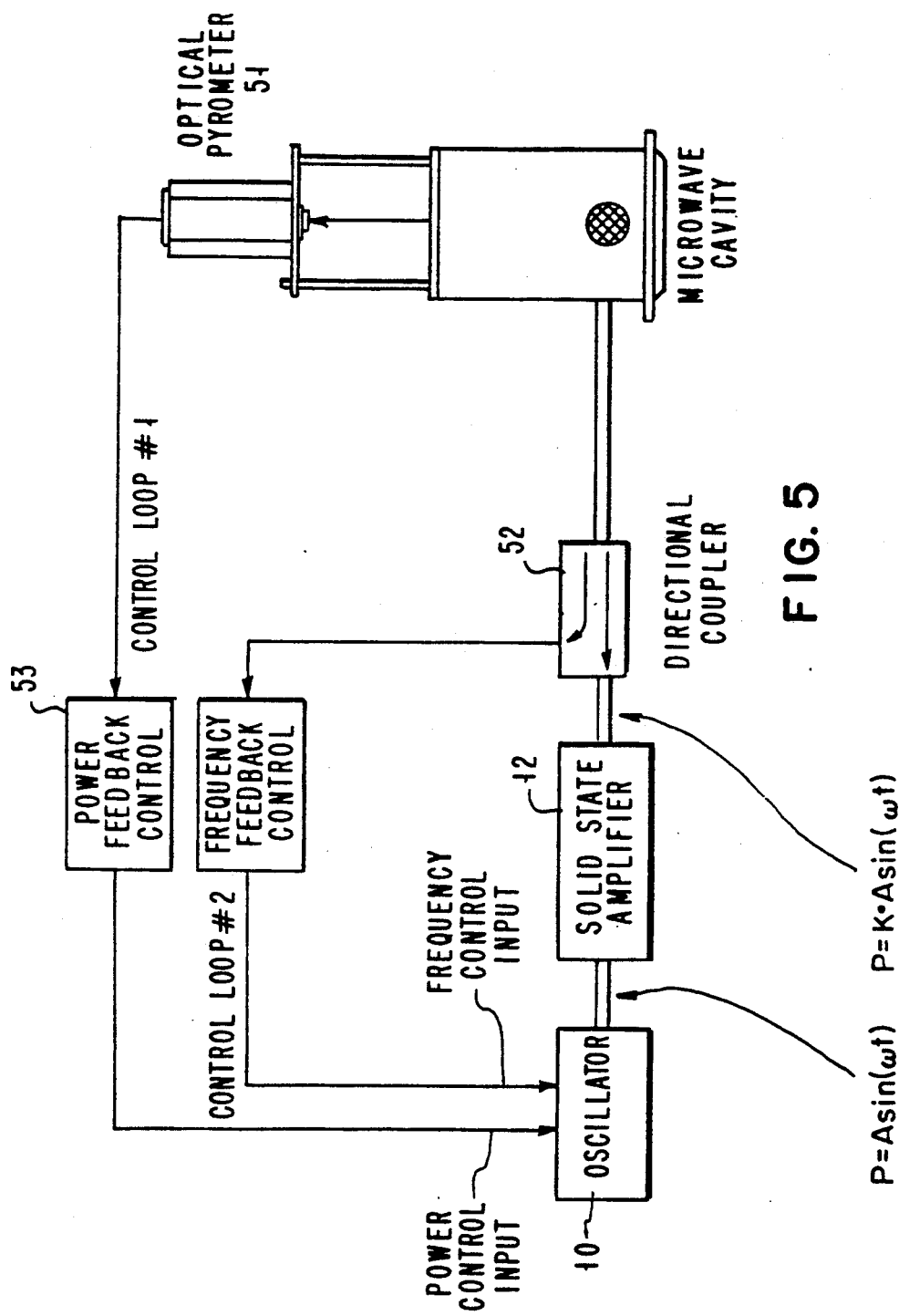
FIG. 5 comprises an overall organizational view of a preferred embodiment of the present solid state energized microwave material processing apparatus showing monitoring and control hardware in place.

FIG. 5 illustrates the application of feedback control to the solid state amplifier/generator of a microwave materials curing application in accordance with the teachings of the present invention. In this example two different feedback loops exist. The first loop prevents overheating by controlling the curing temperature. It does this by controlling the low level signal feeding into the amplifier from the microwave oscillator circuit. The circuitry to control the power at low levels in the oscillator is much simpler than the bulky attenuators, etc., that would be necessary at high power.

The second loop, in effect, controls the tuning of the microwave cavity in which the process is taking place. By doing this it keeps the cavity critically coupled with the amplifier output. It does this by varying the frequency of the oscillator at low power before it is fed into the microwave amplifier. The only other way to do this is by varying the physical dimensions of the cavity, a physically difficult and slow method. It will be noted that optimal coupling is achieved by 'peaking' the power, however, in this instance it is achieved by varying the frequency of the generator while observing the 'reflected power' in the process chamber.

Referring to FIG. 5 a microwave cavity 50, which would serve as the process chamber is illustrated having an optical pyrometer 51, mounted on the top thereof. Microwave energy is fed from the amplifier 12 through a coupler 52 into the cavity 50. The directional coupler 52 merely serves as a tap for monitoring the intensity of the power signal being fed into the cavity and is merely part of the testing circuitry and not of the microwave generator circuitry per se. The optical pyrometer 51 is a device well known in the art and observes the temperature of a test sample within the cavity by monitoring power radiated by the material and produces a signal proportional to the temperature. This signal is fed into the power and control block 53 to produce a feedback control signal, which controls the output power from the oscillator. As is well known in the art it does this by controlling the power term "A" in the formula: $P = A \sin(\omega t)$. It does this most conveniently by controlling the various bias voltage or circuit element within the oscillator as is well known in the art. By controlling the power term "A" of the oscillator output, which may be easily done at the lower power levels involved, a much greater power control on the output from the solid state amplifier is possible. This is because the power output from the amplifier may be represented by the formula: $P = K.A \sin(\omega t)$. This, of course, assumes an amplification factor of K for the solid state amplifier 12.

As the power output from the amplifier 12 is increased or decreased a proportionate increase or decrease in the output of the optical pyrometer 51 will occur indicating an increase or decrease in the temperature from some predetermined level.

Thus control loop #1 controls the maximum power produced by the solid state amplifier and fed into the process chamber by controlling the power term of the power equation as just described.

The second control loop #2 which controls the frequency of the oscillator and thus the coupling of the signal into the microwave cavity in effect monitors what is known as the "reflected" power signal and it is desired to maximize or peak the power in this case by varying the frequency of the oscillator. Thus the power signal fed into the frequency feedback control block 54 controls frequency rather than the power of the oscillator. It does this by varying the appropriate tuning control circuits within the oscillator to vary the frequency term ($\omega$) in the overall power formula P=Asin($\omega$t). It is reiterated that this may be relatively easily done within the oscillator tuning circuitry.

Thus it may be seen that both the power and frequency of the solid state microwave system of the present invention may be easily controlled and varied by controlling the low power oscillator. As was discussed previously, this is virtually impossible with the magnetron types of solid state devices which virtually are fixed within very narrow bands as to both frequency power levels. It will thus be readily apparent that the present invention offers a much more controllable power source for the material processing environment and even offers the possibility of a significant frequency control of the oscillator to gather the process parameters as desired to, for example, treat different materials at a different basic frequency all utilizing essentially the same amplifier, oscillator, etc., apparatus. While the circuitry of FIG. 5 shows a single solid state amplifier and oscillator it will of course be understood that the system could be readily utilized with a multiple amplifier system such as shown in FIG. 2 especially since the control is applied to the oscillator rather than the amplifiers per se.

CONCLUSIONS

There has thus been disclosed and described a novel solid state microwave powered material/plasma processing system which is believed to have great promise in producing novel solid state electronic devices and the like utilizing various plasma processing methods. Utilizing the principles of the present invention, extremely precise control of the plasma parameters may be achieved at much less expense than conventional with tube types of microwave power sources such as magnetrons.

As technology improves and even more powerful high frequency amplifiers become available, the advantages of the present invention will become even more significant.

While the invention has been disclosed and described, with respect to certain preferred embodiments thereof, it is to be clearly understood that many changes and modification in the basic concepts could be made by those skilled in the art without departing form the spirit and scope of the invention as set forth in the specification and appended claims.

LIST OF REFERENCES

1. Jes Asmussen, Journal of Vacuum Science and Technology, A7, (1989) 883.
2. B. E. Cherrington, Gaseous Electronic and Gas Lasers (Pergamon, New York, 1966).
3. John David Jackson, "Classical Electrodynamics", John Wiley & Sons (1975), pp. 209-268.
4. Chemical Effects of Microwave Discharges, James P. Wightman, Proceedings of IEEE, Vol. 62, 1 January 1974.
5. "Handbook of Ion Beam Processing Technology", Edited by J. J. Cuomo and S. M. Rossnagel and H. R. Kaufman, Chapter 3 "ECR Ion Sources" by W. Holber., Notes, 1989.
6. "Handbook of Plasma Processing Technology", Edited by S. M. Rossnagel, J.J. Cuomo and W. Westwood, Chapter 11, "Electron Cyclotron Resonance Microwave Discharge For Etching and Thin Film Deposition", by J. Asmussen, Noyes, 1989.
7. "Microwave Heating and Dielectric Diagnosis Technique in a Single-Mode Resonant Cavity". J. Jow, M. Hawley, M. Finzel and J. Asmussen, Review of Scientific Instruments Vol. 60, No. 1, January 1989.
8. "Microwave Tubes", A. Gilmour, Artech House, Inc., 1986.
9. H. Krauss, C. Bostian and F. Raab, "Solid State Radio Engineering", J. Wiley and Sons, 1980.
10. "Applications of GaAs MESFETS", Edited by R. Soares, J. Graffeuil and J. Obregon, Artech House, Inc., 1983.
11. E. Ostroff, M. Borkowski, H. Thomas and J. Curtis, "Solid-State Radar Transmitters", Artech House, Inc., 1985.
12. R. Allison, "Silicon Bipolar Microwave Power Transistors", IEEE Trans, Vol. MTT-27, No: 5, May 1989, pp. 415-422.

I claim:

1. In a microwave powered material/plasma processing system including a reaction chamber for holding a process workpiece and means for placing a requisite electrical bias on the workpiece, the improvement which comprises:
   a solid state microwave generator for providing greater than one watt of power to said system mounted to directly introduce microwave power into said chamber via a direct radiating antenna,
   means for measuring the frequency, amplitude and power of the microwave radiation in the chamber, and
   means for altering said frequency, amplitude and power at a low power input to a solid state amplifier comprising a part of said generator wherein said means for altering said frequency is separate from said means for altering said amplitude.

2. A microwave powered processing system as set forth in claim 1 wherein said solid state microwave generator comprises a separate low power oscillator and a separate high power amplifier capable of operating at microwave frequencies 3. A microwave powered plasma processing system as set forth in claim 2 wherein said solid state microwave generator comprises a single solid state oscillator driving a plurality of high power solid state microwave amplifiers which, in turn, power a single antenna in parallel.

4. A microwave powered processing system as set forth in claim 1, wherein said antenna is physically attached to the solid state microwave generator substrate and is electrically connected to the generator output and protrudes through an aperture provided in the process chamber.

5. A microwave powered plasma processing system as set forth in claim 1, wherein a plurality of microwave generators are distributed around said chamber to introduce microwave radiative energy into the chamber and means for controlling said generators to produce microwave power at the workpiece surface, which is a function of the square of the number of individual generators times the power of the individual generator.

6. A microwave powered plasma processing system as set forth in claim 2, wherein said means for measuring comprises detector means adjacent to said radiating antenna for measuring the amplitude of a return signal and means for controlling the frequency characteristics of the solid state microwave oscillator in accordance therewith.

7. A microwave powered plasma processing systems as set forth in claim 1, including a plurality of such solid state microwave generators operating at different frequencies connected to said process chamber and means for selectively energizing a particular generator to selectively energize a particlular workpiece or material in a particular chamber.

8. A microwave powered processing system as set forth in claim 2, wherein said solid state oscillator includes control means to produce a desired output microwave frequency and means for selectively causing the oscillator to produce an particular output frequency uniquely adopted to the processing of a particular workpiece within the chamber.

9. A microwave powered plasma processing system as set forth in claim 2 including means for monitoring the power produced by said solid state microwave generator and means responsive thereto for controlling the power output of the solid state oscillator by controlling the power term ("A") of the oscillator as defined by: $P = A \sin(\omega t)$.

10. A microwave powered plasma processing system as set forth in claim 2 including means for monitoring the frequency of the output of the solid state microwave generator and means responsive thereto for controlling the frequency of the output of the solid state microwave oscillator which drives the solid state microwave amplifer.

* * * * *